(12) United States Patent
Ho

(10) Patent No.: US 6,221,693 B1
(45) Date of Patent: Apr. 24, 2001

(54) HIGH DENSITY FLIP CHIP BGA

(75) Inventor: Chung W. Ho, Monte Sereno, CA (US)

(73) Assignee: Thin Film Module, Inc., Hsin-Chu (TW)

( * ) Notice: Subject to any disclaimer, the term of this patent is extended or adjusted under 35 U.S.C. 154(b) by 0 days.

(21) Appl. No.: 09/332,427

(22) Filed: Jun. 14, 1999

(51) Int. Cl.[7] .................................................. H01L 21/48
(52) U.S. Cl. ............................................ 438/108; 438/108
(58) Field of Search ................................ 438/14, 26, 48, 438/108, 118, 106, 15, 613

(56) References Cited

U.S. PATENT DOCUMENTS

| | | | |
|---|---|---|---|
| 5,291,062 | * 3/1994 | Higgins, II ............................ | 257/698 |
| 5,485,038 | 1/1996 | Licari et al. ............................ | 257/758 |
| 5,509,553 | 4/1996 | Hunter, Jr. et al. ...................... | 216/13 |
| 5,525,834 | 6/1996 | Fischer et al. .......................... | 257/691 |
| 5,724,232 | 3/1998 | Bhatt et al. ............................ | 361/762 |
| 5,830,563 | 11/1998 | Shimoto et al. ......................... | 428/209 |
| 5,837,427 | 11/1998 | Hwang et al. .......................... | 430/312 |
| 5,877,551 | 3/1999 | Tostado et al. ......................... | 257/701 |
| 5,969,426 | * 10/1999 | Baba et al. ............................ | 257/778 |
| 5,977,633 | * 11/1999 | Suzuki et al. .......................... | 257/738 |
| 6,080,936 | * 6/2000 | Yamasaki et al. ....................... | 174/263 |

* cited by examiner

*Primary Examiner*—David Nelms
*Assistant Examiner*—David Nhu
(74) *Attorney, Agent, or Firm*—George O. Saile; Stephen B. Ackerman

(57) ABSTRACT

A new method is provided for mounting high-density flip chip BGA devices. A dielectric layer is first deposited over the first surface of a metal panel. One or more thin film interconnect layers are created on top of the dielectric layer. The interconnect layers are patterned in succession to create metal interconnect pattern. The BUM technology allows for the creation of a succession of layers over the thin film layers. The BUM layers can be used for power or ground distribution and for signal or fan-out interconnect. A cavity is etched on the second surface of the metal panel. A laser is used to create openings for flip chip pad contacts. The panel is subdivided into individual substrates. The method of the invention can also be applied to Land Grid Array and Pin Grid Array devices.

18 Claims, 4 Drawing Sheets

HIGH DENSITY FLIP CHIP BGA

BACKGROUND OF THE INVENTION

1. Field of the Invention

The invention relates to the fabrication of integrated circuit devices, and more particularly, to a novel process and structure for making packaging substrates for flip chip semicoductor devices.

2. Description of the Prior Art

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines.

Increased Input-Output (IO) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

The invention teaches a novel process and structure for creating packaging substrates that are used for flip chip semiconductor devices. The packaging substrate is generally used for Ball Grid Array (BGA) packages but can also be used for Land Grid Array (LGA) and Pin Grid Array (PGA) packages.

Prior Art substrate packaging uses ceramic and plastic BGA packaging. Ceramic substrate packaging is expensive and has proven to limit the performance of the overall package. Recent years has seen the emergence of plastic substrate BGA packaging, this type of packaging has become the main stream design and is frequently used in high volume BGA package fabrication. The plastic substrate BGA package performs satisfactorily when used for low-density flip chip Integrated Circuits (IC's). If the number of pins emanating from the IC is high, that is in excess of 350 pins, or if the number of pins coming from the IC is less than 350 but the required overall package size is small (resulting in a solder ball pitch of less than 1.27 um.), the plastic BGA structure becomes complicated and expensive. This can be traced to the multi-layer structure used to create the plastic BGA package. This multi-layer structure for the plastic BGA interconnect package is referred to as the Build Up Multi-layer or BUM approach and results in a line density within the package of typically 2–3 mil or 50 u–75 u range. This line density is not sufficiently high for realizing the fan out from the chip I/O to the solder balls on the package within a single layer. This leads to the multi-layer approach. The multi-layer approach brings with it the use of relatively thick (50 u–75 u) dielectric layers, these layers have a Coefficient of Thermal Expansion (CTE) that is considerably higher than the CTE of the laminate board on which the plastic BGA package is mounted. To counteract this difference in CTE's the BUM layers must be (thermally and mechanically) balanced on the other side (the side of the board that does not usually require an interconnect density provided by the BUM layers) of the laminate board. This latter requirement results in the use of additional material and processing steps to apply these materials, increasing the cost of the BGA package and creating a yield detractor.

Other Prior Art applications use thin film interconnect layers for chip or wire bond packaging substrates. These applications start with a laminate substrate onto which the thin film layers are deposited. An example of these thin film applications is the NEC (U.S. Pat. No. 5,830,563) approach. For these applications, the laminate substrate is used as a base carrier substrate and provides the mechanical support. Plated Through Holes (PTH) are mechanically drilled through the laminate substrate and are used to establish connections to the backside of the substrate for solder ball attach and electrical contacts. By using thin films, high wire density and very thin dielectric layers can be realized. This approach also does not, unlike the BUM approach, require to counter-balance thick layers of dielectric in order to establish dimensional stability. A disadvantage of the laminate substrate is that the process of mechanically drilling holes through the laminate substrate is time-consuming adding cost to the process. Further, the planarity of the laminate substrate does not meet planarity requirements for the deposition of thin films. Good planarity for the surface of the laminate substrate is established by depositing dielectrics and metal layers on the initial surface of the laminate structure, steps that again add to the processing cost of the BGA structure. Since the laminate substrate is composed using organic materials, the substrate is not dimensionally stable resulting in warpage and dimensional variations during high temperature processing and wet chemical interactions. This results in additional processing complications and costs.

U.S. Pat. No. 5,509,553 (Hunter, Jr. et al.) shows a (3) metal layer process (DEMR) (see FIG. 5A) that appears to comprise a) sputter plating base b) plating metal (semi-additive plating), see col. 2.

U.S. Pat. No. 5,830,563 (Shimoto et al.) discloses a laminate substrate with thin films deposited thereon.

U.S. Pat. No. 5,837,427 (Hwang et al.) shows a (4) BUM process for a PCB.

U.S. Pat. No. 5,724,232 (Bhatt et al.) shows a package with a (1) metal substrate.

U.S. Pat. No. 5,525,834 (Fischer et al.) shows a package having a Cu substrate, thin dielectric layers (1–25 um thick) and thin dielectric layers (12 to 75 um), see col. 7 and 8.

U.S. Pat. No. 5,877,551 (Tostado et al.) discloses a package having a metal substrate with (2) dielectric layers formed of polymers, epoxy (3 to 100 um), see col. 4.

U.S. Pat. No. 5,485,038 (Licari et al.) teaches a package using a photo-imagable epoxy dielectric layer.

SUMMARY OF THE INVENTION

A principle objective of the invention is to provide an inexpensive and reliable method for high-density flip chip BGA manufacturing.

Another objective of the invention is to reduce performance limitations imposed by Prior Art high-density flip chip BGA manufacturing techniques.

Yet another objective of the invention is to provide for high pin fan-out for flip chip BGA devices.

Yet another objective of the invention is to eliminate the need for counter-balancing the effects of thick layers of dielectric used in conventional high density flip chip BGA device manufacturing.

Yet another objective of the invention is to provide a method of packaging high density flip chip BGA devices by using Build Up Material (BUM) technology in combination with thin film deposition techniques.

Yet another objective of the invention is to provide an initial surface with good planarity for the creation of high-density flip chip BGA structures.

A still further objective of the invention is to provide a structure devoid of warpage and dimensional variations during high temperature or wet chemical processing for the creation of high density flip chip BGA structures.

In accordance with the objectives of the invention a new method is provided for mounting high density flip chip BGA devices. The invention starts with a metal panel on which a dielectric layer is first deposited. A number of thin film interconnect layers are then created on top of the dielectric layer, these interconnect layers can be two or three or more in number. The interconnect layers are patterned in succession to create metal interconnect patterns. The BUM technology allows for the creation of a succession of layers over the thin film layers. Each of the layers created in this manner can be created for a specific function such as power or ground distribution and signal or fan-out interconnect.

DESCRIPTION OF THE PREFERRED EMBODIMENTS

Figure 1:
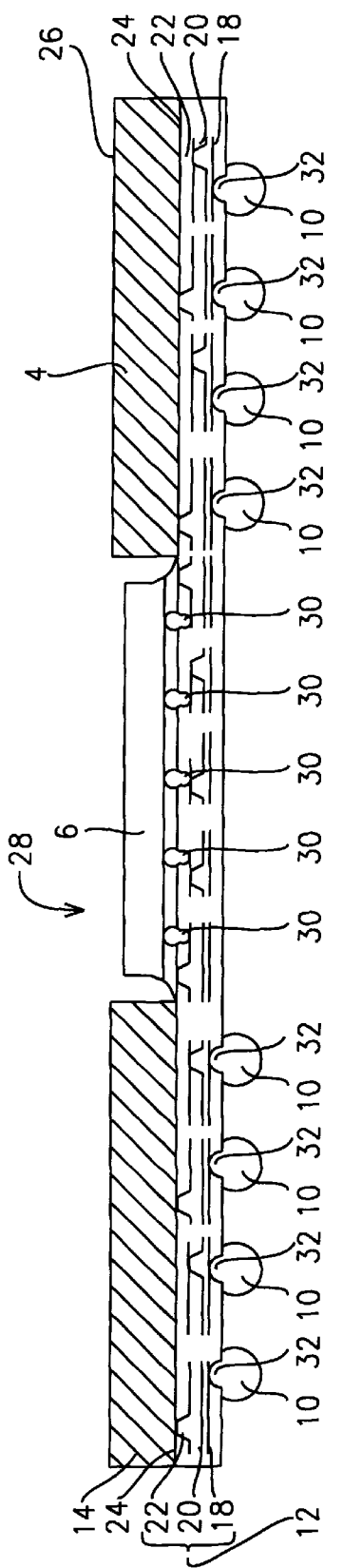
FIG. 1. shows a single chip flip chip package with three interconnect layers.

Referring now specifically to FIG. 1, there is shown a cross section of a single chip flip chip with three interconnect layers.

The interconnect substrate 12 contains the totality of the sequence of layers that are created within the scope of the invention for making a high density packaging substrate.

The interconnect substrate 12 has two surfaces. The surface of the interconnect that is in contact with the metal substrate 14 is the second surface of the interconnect substrate, the surface of the interconnect substrate into which the contact balls 10 are mounted is the first surface of the interconnect substrate.

The metal layer within the interconnect substrate 12 that is closest to the first surface 24 of the metal substrate 14 is referred to as the bottom layer, the metal layer within the interconnect substrate 12 that is furthest removed from the first surface 24 of the metal substrate 14 is referred to as the top layer.

The metal substrate 14 has two surfaces, the first surface 24 of the metal substrate is the surface on which the interconnect substrate 12 is created. The second surface 26 of the metal substrate is the surface into which openings are etched for the insertion of BGA chips.

The three interconnect layers within the interconnect substrate 12 are highlighted as 18 (which can be a ground layer), 20 (which can be a power layer) and 22 (which can be a signal layer). Metal substrate 14, typically copper, is about 30 mils thick. The metal used for substrate 14 is not limited to copper but can be other metals such as aluminum or stainless steel. The size of the metal substrate 14 is typically 18×24 inches but the size of the metal substrate 14 is not limited to these dimensions. The invention uses the Build Up Multilayer (BUM) technology (a printed circuit board technology) in combination with thin film deposition technology (a technology used for the creation of flat panels).

It must be noted from FIG. 1 that the metal substrate 14 and the contact balls 10 are mounted on opposite sites of the interconnect substrate 12 while the metal substrate 14 and the contact balls 10 are also aligned with each other (the metal substrate 14 is located above the contact balls 10). The IC 16 is mounted in an opening 28 created in the metal substrate 14. The opening 28 into which the flip chip 16 is mounted is a cavity that is created by masking and etching of the second side 26 of the metal substrate 14.

A dielectric layer (not shown) is first deposited over the metal substrate 14 on the first side 24 of the metal substrate 14 as a first step in the creation of the interconnect substrate 12. This deposition of the dielectric can be done by either lamination or by a coating and curing process. The layer of dielectric typically has a thickness of between about 10 and 40 um. It a required that the dielectric has a CTE that is higher than the CTE of the metal substrate. This to assure that, after the metal substrate with the deposited layer of dielectric are cooled down to room temperature, the dielectric film is under tension. The dielectric layer can be epoxy with or without a thin glass reinforcement, a polyimide film or any other build-up dielectric material.

Figure 5A:
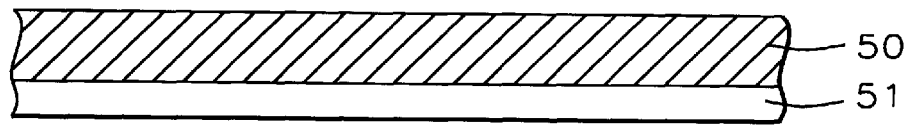
FIG. 5 shows the processing steps used during the thin film deposition process.
Figure 5B:
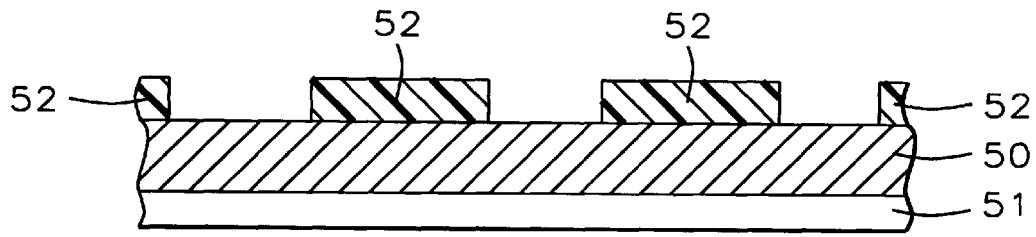
Figure 5C:
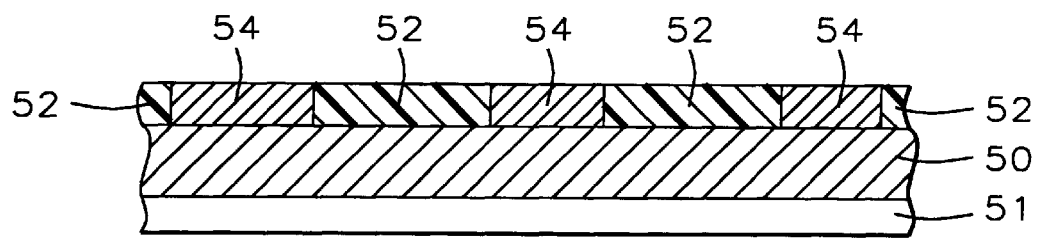
Figure 5D:
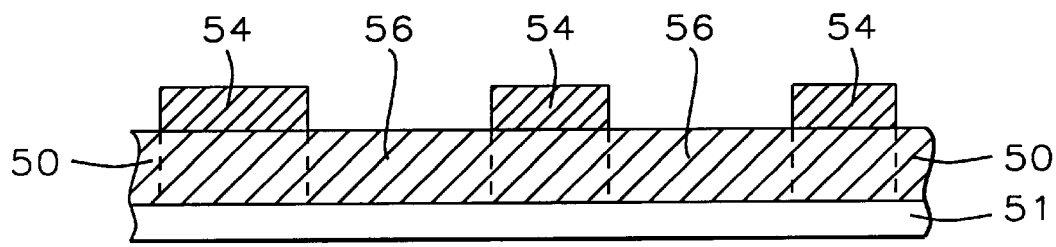
Figure 5E:
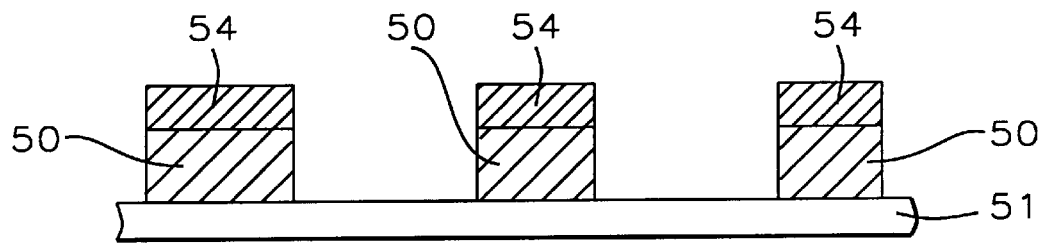
Figure 5F:
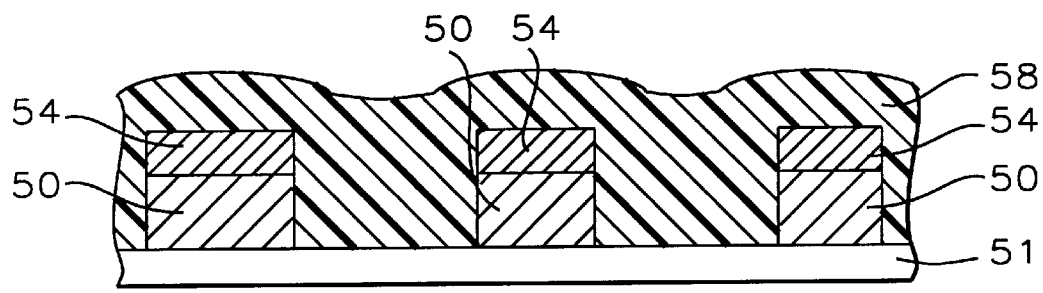

The first step in the creation of the interconnect substrate 12 is the creation of a thin film interconnect metal layer 22 on top of the layer of dielectric. The thin film deposition technique contains the following steps, see FIG. 5:

FIG. 5a, depositing an interconnect plating base 50 by consecutive sputtering of Cr, Au and Cr FIG. 5b, masking and patterning 52 for semi-additive plating of the interconnect pattern;

FIG. 5c, wet etching the thin Cr layer to expose the Au, depositing semi-additive plating 54 of the interconnect pattern by depositing Au, Ni and Cu;

FIG. 5d, removing of the mask 52 (FIG. 5b) for the semi-additive plating of the interconnect pattern;

FIG. 5d, wet etching to remove the sputtered plating base 56, FIG. 5d, from between the interconnect pattern 54;

coating the created interconnect pattern with a layer 58 of dielectric;

for applications where solder connections need to be made to the interconnect pattern the above dielectric forms a solder mask and vias are created in the dielectric for the solder connections.

The state of the art BUM technology provides the technology to add layers 20 and 18 on top of the created thin film interconnect layer 22, these added layers 20 and 18 typically can be for power and ground interconnects but can also be used for fan-out interconnections. Patterns are created in the additional layers 20 and 18, typically for ground and power distribution but not limited to this. The last layer created in this manner, that is the layer 18 in FIG. 1 or the layer furthest removed from the first side 24 of the metal substrate 14, must provide the interconnects with the contact balls of the BGA structure and must therefore be coated as a solder mask.

Figure 6A:
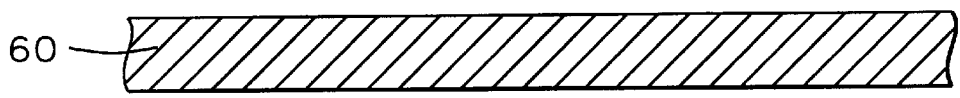
FIG. 6 shows the processing steps used during the BUM process.
Figure 6B:
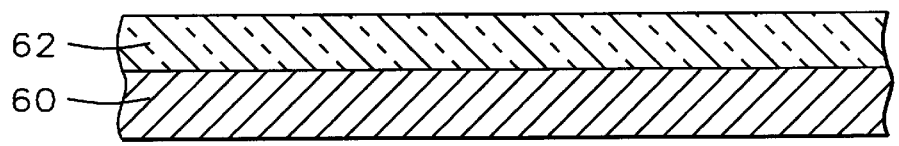
Figure 6C:
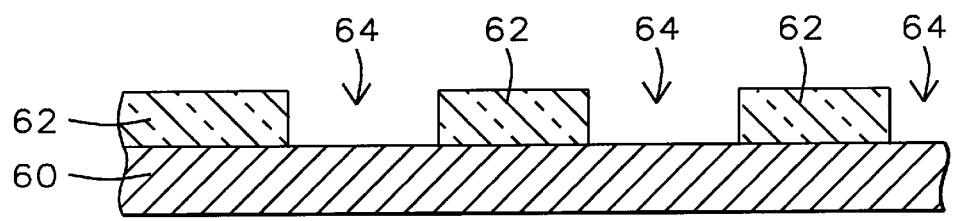
Figure 6D:
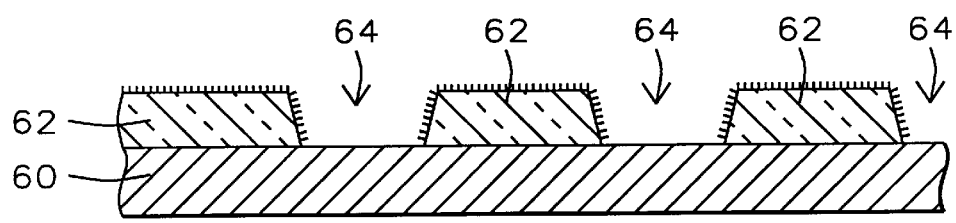
Figure 6E:
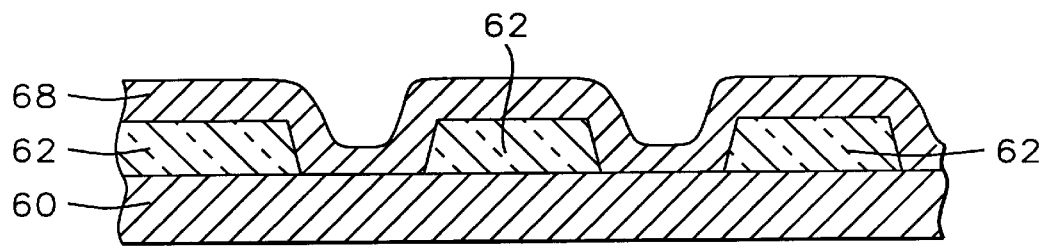
Figure 6F:
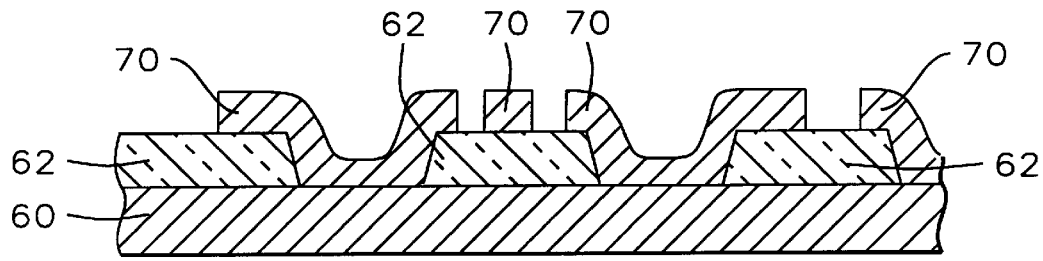

The BUM state of the art technology contains the following processing steps, see FIG. 6:

FIG. 6a, the starting substrate 60 can be a metallized or it can also be a cleaned metal substrate panel without any interconnect layers;

FIG. 6b, coating of the substrate 60 with a layer 62 of dielectric;

FIG. 6c, creating of vias 64 in the dielectric 62 for electrical connections to the substrate 60;

FIG. 6d, etching and swelling of the dielectric 62 to roughen the surface and thereby promote adhesion for the subsequent electroless copper deposition;

FIG. 6d, electroless seeding of the dielectric;

FIG. 6e, plating of the panel with a layer 68 of copper;

FIG. 6f, masking and etching the deposited layer of copper to create the metal pattern 70 in the BUM layer.

The second side 26 of the metal substrate must next be prepared for the mounting of the flip chip; an opening or cavity 28 must therefore be created in the metal substrate 14 that can accommodate the flip chip. The second side 26 of the metal substrate 14 is therefore masked and wet etched to create the opening 28 in the metal substrate 14. The size of this opening can vary and depends on the number of flip chips that are to be mounted on the interconnect substrate 12. The wet etch of the second side 26 of the metal substrate exposes the dielectric layer that has previously been deposited (on the first side 24 of the metal substrate 14, see above). Openings 30 must be created in this layer of dielectric through which the flip chip 16 can be connected to the contact points in the first layer 22. A laser is used to create these openings.

The openings 32 for the BGA solder ball connections are created to expose the top metal pads (the pads in the interconnect layer 12 that are furthest away from the metal substrate 14). The flip chip 16 is inserted into the interconnect layer 12 within the cavity 28, the interconnect layer 12 is brought into contact with the contact balls 10, electrical contact is then established between the flip chip 16 and the contact balls 10.

Figure 2:
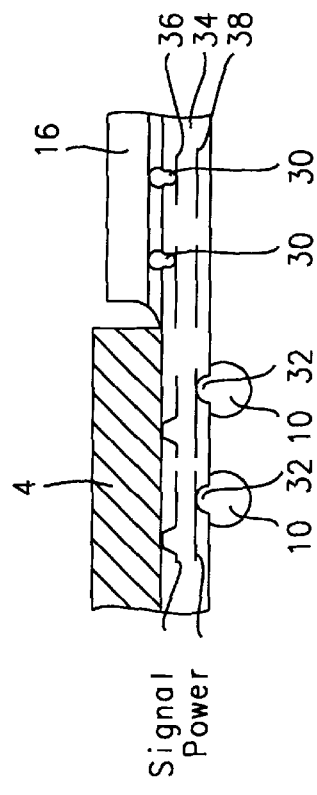
FIG. 2 shows a single chip flip chip package with two interconnect layers.

FIG. 2 shows a cross section of a single chip package where the interconnect substrate 34 contains two interconnect layers 36 and 38. Typically layer 36 will be a thin film interconnect metal layer while layer 38 can be a power layer.

Figure 3:
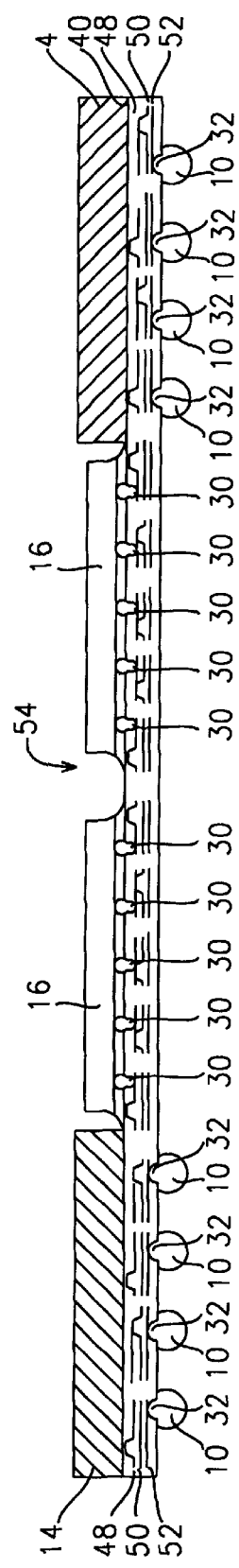
FIG. 3 shows a multichip package with three interconnect layers.

FIG. 3 shows a cross section of a multi-chip structure that contains three interconnect layers in the interconnect substrate. Two flip chips 16 are mounted in a (larger) cavity 54 created within the metal substrate 14. In the example shown in FIG. 3, two thin film interconnect layers 48 and 50 have been created in the interconnect substrate in addition to a BUM power supply layer 52.

Figure 4:
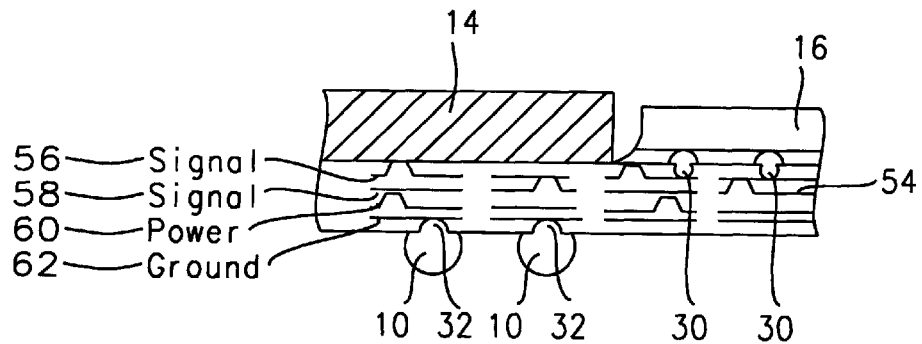
FIG. 4 shows a multichip package with four interconnect layers.

FIG. 4 shows a cross section of a multi chip package with four interconnect layers contained within the interconnect substrate. Two thin film interconnect layers 56 and 58 have been created as signal interconnects, layer 60 is a BUM power layer while layer 62 is a BUM ground layer. This interconnect substrate 54 can contain more than one flip chips 16, in accordance with desired design requirements.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A method of forming a package for mounting of at least one row of Ball Grid Array chips by forming an interconnect substrate on a metal panel, comprising the steps of:

providing a metal substrate having a Coefficient of Thermal Expansion, said metal substrate further having a first surface and a second surface;

cleaning the first surface of said metal substrate;

depositing a first layer of dielectric having a Coefficient of Thermal Expansion over said first surface of said metal substrate;

depositing a thin film interconnect layer having a surface over said first layer of dielectric, forming the first layer of an interconnect substrate, said first layer of interconnect substrate having a surface comprising a partially exposed second layer of dielectric, further comprising copper contact pads;

creating a first Build Up Multilayer (BUM) layer over said thin film interconnect layer, forming a second layer of said interconnect substrate, said second layer of interconnect substrate having a surface comprising a partially exposed third layer of dielectric, further comprising copper contact pads;

creating a second Build Up Multilayer (BUM) layer over said first Build Up Multilayer layer, forming a third layer of an interconnect substrate, said third layer of interconnect substrate having a surface comprising a partially exposed fourth layer of dielectric, further comprising copper contact pads;

coating said second BUM layer with a solder mask;

exposing metal pads within said second BUM layer thereby creating openings for BGA solder connections;

masking and etching said second surface of said metal substrate, creating at least one opening for the insertion of at least one BGA chip, furthermore exposing portions of said first layer of dielectric within said openings;

creating openings in said exposed first layer of dielectric, providing electrical access to said interconnect substrate for said at least one BGA chip; and subdividing said metal substrate into individual BGA substrates.

2. The method of claim 1 wherein said depositing a first layer of dielectric over said first surface of said metal substrate is creating a layer of dielectric with a thickness between about 10 and 20 um.

3. The method of claim 1 wherein said depositing a thin film interconnect pattern, comprises the steps of:

depositing an interconnect plating base having a surface over said first layer of dielectric by depositing a first layer of Cr, a first layer of Au, and a second layer of Cr;

depositing a layer of photoresist over said interconnect plating base;

masking and patterning said layer of photoresist, creating a mask of photoresist;

etching the second layer of Cr to expose portions of the underlying first layer of Au contained within the interconnect plating base;

forming a semi-additive plating on said exposed portions of the underlying first layer of Au contained within the interconnect plating base by depositing a second layer of Au, a first layer of Ni and a first layer of Cu;

removing said mask of photoresist to expose portions of said interconnect plating base;

wet etching said exposed portions of said interconnect plating base to form a thin film interconnect pattern comprising said etched interconnect plating base and said semi-additive plating;

coating the thin film interconnect pattern with a second layer of dielectric; and creating vias in the second layer of dielectric for connections to an overlying layer.

4. The method of claim 1 wherein said depositing a thin film interconnect layer comprises the steps of:

depositing an interconnect plating base having a surface over said first layer of dielectric by depositing a first layer of Cr, a first layer of Cu and a second layer of Cr;

depositing a layer of photoresist over the surface of said interconnect plating base;

masking and patterning said layer of photoresist, creating a mask of photoresist;

etching the second layer of Cr to expose portions of the underlying first layer of Cu contained within the interconnect plating base;

forming a semi-additive plating on said exposed portions of the underlying first layer of Cu contained within the interconnect plating base by depositing a second layer of Cu;

removing said mask of photoresist to expose portions of said interconnect plating base;

wet etching said exposed portion of said interconnect plating base to form a thin film interconnect pattern comprising said etched interconnect plating base and said semi-additive plating;

coating the created thin film interconnect pattern with a second layer of dielectric;

creating vias in the second layer of dielectric thereby exposing copper pads for connections to an overlying layer; and performing an additional electroless step by depositing Ni and Au on the exposed copper pads thereby ensuring a reliable solder connection to the chip said step to be taken after said creating openings for BGA solder connections.

5. The method of claim 1 wherein said creating a first and second Build Up Multilayer (BUM) layer comprises the steps of:

coating the thin film interconnect layer with a third dielectric layer;

etching and swelling said third dielectric layer to promote adhesion to subsequent electroless plating of a first BUM layer of copper, creating a pattern in said third layer of dielectric having a surface over the surface of said thin film interconnect layer, partially exposing the surface of said thin film interconnect layer;

electrolytic plating the surface of said patterned third dielectric layer of copper, including the surface of said partially exposed thin film interconnect layer;

masking and etching said first BUM layer of copper to create a metal pattern in said first BUM layer, having a surface comprising a partially exposed third layer of dielectric, further comprising exposed copper contact pads, completing the creation of said first BUM layer;

repeating previous steps, creating said second BUM layer, by coating said created metal pattern in said first BUM layer with a fourth layer of dielectric, etching and swelling said fourth layer of dielectric, creating a pattern in said fourth layer of dielectric having a surface, partially exposing the surface of said first BUM layer, electrolytic plating of the surface of said patterned third dielectric layer with a second BUM layer of copper, including the surface of said partially exposed first BUM layer, masking and etching said second BUM layer of copper to create a metal pattern in said second BUM layer, thereby completing said second BUM layer having a surface comprising a partially exposed fourth layer of dielectric, further comprising copper contact pads;

coating said surface of said second BUM layer with a fifth layer of dielectric; and forming a solder mask by creating vias in the fifth layer of dielectric for connections to BGA solder balls.

6. The method of claim 1 with an additional electroless plating step of depositing a Ni and Au layer on top of the exposed copper in the openings created in said fourth layer of dielectric to ensure a reliable solder connection to a printed circuit board, said additional step to be taken after said exposing metal pads within said second BUM layer.

7. The method of claim 1 wherein said metal substrate contains an element selected from the group of copper or aluminum or stainless steel.

8. The method of claim 1 wherein said metal substrate is a steel panel of the material 400 series said steel panel having a Coefficient of Thermal Expansion (CTE) of about 6.1 ppm degrees C.

9. The method of claim 1 wherein said metal substrate is less than 40 mills thick and has planar dimensions that are large enough to provide for one or more surfaces each surface having a dimension of about 18×24 inches without however being limited to these dimensions.

10. The method of claim 1 whereby the Coefficient of Thermal Expansion of said first layer of dielectric exceeds the Coefficient of Thermal Expansion of said metal substrate by a measurable amount.

11. The method of claim 1 wherein said first, second, third and fourth layers of dielectric comprise an element selected from the group of epoxy with or without thin glass reinforcement or polyimide or a composite dielectric and is deposited to a thickness between about 10 and 40 um using either lamination techniques or coating and curing techniques.

12. The method of claim 1 wherein said masking and etching said second surface of said metal substrate creates an opening for the insertion of at least one BGA chip.

13. The method of claim 1 wherein said claim is restricted to adding one BUM power supply layer to the thin film interconnect layer.

14. The method of claim 1 wherein creating said interface substrate when proceeding from a side of the interface substrate that is closest to said metal substrate comprises the steps of:
- depositing a first thin film interconnect layer over said first layer of dielectric;
- depositing a layer of dielectric for a second thin film interconnect layer and a second thin film interconnect layer over said first thin film interconnect layer;
- depositing a layer of dielectric for a BUM layer and a BUM layer over said second thin film interconnect layer;
- coating a sixth layer of dielectric over said BUM layer;
- creating vias in the sixth layer of dielectric such that said sixth layer of dielectric serves as a solder mask for connections between said BUM layer and BGA contact balls; and
- providing an opening in said second surface of said metal substrate for insertion of at least one BGA chip.

15. The method of claim 1 wherein creating the interface substrate when proceeding from a side of the interface substrate that is closest to said metal substrate comprises the steps of:
- depositing a first thin film interconnect layer over said first layer of dielectric;
- depositing a layer of dielectric for a second thin film interconnect layer and a second thin film interconnect layer over said first thin film interconnect layer;
- coating a layer of dielectric over said second thin film interconnect layer;
- creating vias in the layer of dielectric, whereby the dielectric serves as a solder mask for connections to BGA contact balls; and
- providing at least one opening in said second surface of said metal substrate for the insertion of at least one BGA chip.

16. The method of claim 1 wherein creating of the interconnect substrate when proceeding from a side of the interconnect substrate that is closest to said metal substrate comprises the steps of:
- depositing a first thin film interconnect layer over said first layer of dielectric;
- depositing a layer of dielectric for a second thin film interconnect layer and a second thin film interconnect layer over said first thin film interconnect layer;
- depositing a layer of dielectric for a first BUM layer and a first BUM layer over said second thin film interconnect layer;
- depositing a layer of dielectric for a second BUM layer and a second BUM layer over said first BUM layer;
- depositing a coating of dielectric over said second BUM layer;
- creating vias in the dielectric that serve as a solder mask for connections between the second BUM layer and BGA contact balls; and
- creating at least one opening in said second surface of said metal substrate for insertion of at least one BGA chip.

17. The method of claim 1 whereby said Grid Array is selected from the group consisting of Ball Grid Array (BGA) devices, Land Grid Array (LGA) devices and Pin Grid Array (PGA) devices whereby furthermore a multiplicity of BGA, LGA and PGA devices is interconnected via said interconnect substrate.

18. The method of claim 1 whereby said claim is extended to include creating a multiplicity of Build Up Multilayer structures and a multiplicity of interconnect layers said BUM layers overlying said interconnect layers said interconnect layers to be deposited over said dielectric deposited on said first surface of said metal substrate.

* * * * *